US009666418B2

(12) United States Patent
Tsukamoto et al.

(10) Patent No.: US 9,666,418 B2
(45) Date of Patent: May 30, 2017

(54) TITANIUM TARGET FOR SPUTTERING

(75) Inventors: Shiro Tsukamoto, Ibaraki (JP);
Nobuhito Makino, Ibaraki (JP);
Atsushi Fukushima, Ibaraki (JP);
Kazuto Yagi, Ibaraki (JP); Eiji Hino,
Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 208 days.

(21) Appl. No.: 14/353,507

(22) PCT Filed: Apr. 27, 2012

(86) PCT No.: PCT/JP2012/061412
§ 371 (c)(1),
(2), (4) Date: Apr. 23, 2014

(87) PCT Pub. No.: WO2013/105283
PCT Pub. Date: Jul. 18, 2013

(65) Prior Publication Data
US 2014/0251802 A1 Sep. 11, 2014

(30) Foreign Application Priority Data

Jan. 12, 2012 (JP) ................................. 2012-003732

(51) Int. Cl.
| C23C 14/34 | (2006.01) |
| H01J 37/34 | (2006.01) |
| C22C 14/00 | (2006.01) |
| C22C 1/10 | (2006.01) |

(52) U.S. Cl.
CPC ............ H01J 37/3426 (2013.01); C22C 1/10 (2013.01); C22C 14/00 (2013.01); C23C 14/3414 (2013.01)

(58) Field of Classification Search
CPC ....... C22C 1/10; C22C 14/00; C23C 14/3414; H01J 37/3426
USPC ........................................ 204/298.12, 298.13
See application file for complete search history.

(56) References Cited

U.S. PATENT DOCUMENTS

| 5,993,621 | A | 11/1999 | Liu |
| 6,210,502 | B1 | 4/2001 | Takahashi |
| 6,302,977 | B1 | 10/2001 | Liu |
| 6,755,948 | B1 | 6/2004 | Fukuyo et al. |
| 8,663,440 | B2 * | 3/2014 | Tsukamoto ......... C23C 14/3414 204/298.12 |
| 2013/0186753 | A1 | 7/2013 | Tsukamoto et al. |
| 2014/0027277 | A1 | 1/2014 | Makino et al. |

FOREIGN PATENT DOCUMENTS

JP    2010-235998 A    10/2010

OTHER PUBLICATIONS

Machine Translation of JP 2010-235998 dated Oct. 2010.*

* cited by examiner

*Primary Examiner* — Rodney McDonald
(74) *Attorney, Agent, or Firm* — Howson & Howson, LLP

(57) ABSTRACT

A high-purity titanium target for sputtering containing 0.5 to 5 mass ppm of S as an additive component, wherein the purity of the target excluding additive components and gas components is 99.995 mass percent or higher. An object of this invention is to provide a high-quality titanium target for sputtering which is free from fractures and cracks during high-power sputtering (high-rate sputtering) and is capable of stabilizing the sputtering characteristics.

17 Claims, 2 Drawing Sheets

FE-SEM

EDX (Bright section indicates high S)

TITANIUM TARGET FOR SPUTTERING

BACKGROUND

The present invention relates to a high-quality titanium target for sputtering which is free from the generation of fractures and cracks during high-power sputtering (high-rate sputtering) and is capable of stabilizing the sputtering characteristics.

The impurity concentration described in the present specification will be displayed in mass fraction (mass percent or ppm) in all cases.

In recent years, various electronic devices have been devised beginning with the exponential advancement of semiconductors, and the improvement of the performance thereof as well as the development of new devices are being sought on a daily basis.

Under these circumstances, there is an inclination toward the miniaturization of electronic devices and equipment and increase in the degree of integration thereof. Various thin films are formed during the manufacturing process of many of such devices and equipment, and titanium, from its unique metallic property, is used in the formation of thin films for various electronic devices as titanium and its alloy film, titanium silicide film, titanium nitride film or the like.

Generally speaking, the aforementioned titanium and its alloy film, titanium silicide film or titanium nitride film can be formed with a physical deposition method such as sputtering or vacuum deposition. Explained below is the sputtering method which is used most comprehensively among the above.

This sputtering method is a method of physically colliding positive ions such as $Ar^+$ to a target disposed on a cathode and discharging the metal atoms structuring the target with the collision energy thereof. Nitrides can be formed by using titanium or its alloy (TiAl alloy, etc.) as the target and conducting sputtering under a mixed gas atmosphere of argon gas and nitrogen.

In recent years, in order to improve the production efficiency, there are demands for high-rate sputtering (high-power sputtering). Here, there are cases where the target is subject to fractures or cracks, and this has caused a problem of preventing stable sputtering. Patent Document 1 and Patent Document 2 listed below are cited as prior art documents.

Moreover, as shown in Patent Document 3, the present Applicant provided a titanium target for sputtering which is free from fractures and cracks during high-power sputtering (high-rate sputtering) and is capable of stabilizing the sputtering characteristics. While this is extremely useful for achieving the foregoing object, there were demands for achieving superior effects with fewer types of additive elements and a smaller additive amount for use in a high-purity sputtering target for semiconductors, and this point was an additional challenge.

Patent Document 1: International Publication No. WO01/038598
Patent Document 2: JP 2001-509548 A
Patent Document 3: JP 2010-235998 A

SUMMARY OF INVENTION

The present invention was devised in order to resolve the various problems described above. Thus, an object of this invention is to provide a high-quality titanium target for sputtering which is free from fractures and cracks during high-power sputtering (high-rate sputtering) and is capable of stabilizing the sputtering characteristics.

The present invention provides: 1) a high-purity titanium target for sputtering containing 0.5 to 5 mass ppm of S as an additive component, wherein the purity of the target excluding additive components and gas components is 99.995 mass percent or higher.

The present invention additionally provides: 2) a high-purity titanium target for sputtering containing 0.5 to (less than) 3 mass ppm of S in total as an additive component, wherein the purity of the target excluding additive components and gas components is 99.995 mass percent or higher.

The present invention additionally provides: 3) the titanium target for sputtering according to 1) or 2) above, wherein the purity of the target excluding additive components and gas components is 99.999 mass percent or higher; 4) the titanium target for sputtering according to any one of 1) to 3) above, wherein an average crystal grain size of the target is 60 μm or less; 5) the titanium target for sputtering according to any one of 1) to 3) above, wherein an average crystal grain size of the target is 30 μm or less; 6) the titanium target for sputtering according to any one of 1) to 5) above, wherein 0.2% proof stress of the titanium target upon heating the target to 500° C. is 25 MPa or more; 7) the titanium target for sputtering according to any one of 1) to 5) above, wherein 0.2% proof stress of the titanium target upon heating the target to 500° C. is 30 MPa or more; 8) the titanium target for sputtering according to any one of 1) to 7) above, wherein S deposit count in the crystal structure of the titanium target is 100 deposits/mm$^2$ or less; 9) the titanium target for sputtering according to any one of 1) to 7) above, wherein S deposit count in the crystal structure of the titanium target is 30 deposits/mm$^2$ or less; and 10) the titanium target for sputtering according to any one of 1) to 7) above, wherein S deposit count in the crystal structure of the titanium target is 10 deposits/mm$^2$ or less.

The titanium target for sputtering of the present invention yields a superior effect in that it is free from fractures and cracks even during high-power sputtering (high-rate sputtering) and is capable of stabilizing the sputtering characteristics and forming a high-quality film.

DETAILED DESCRIPTION

Figure 1:
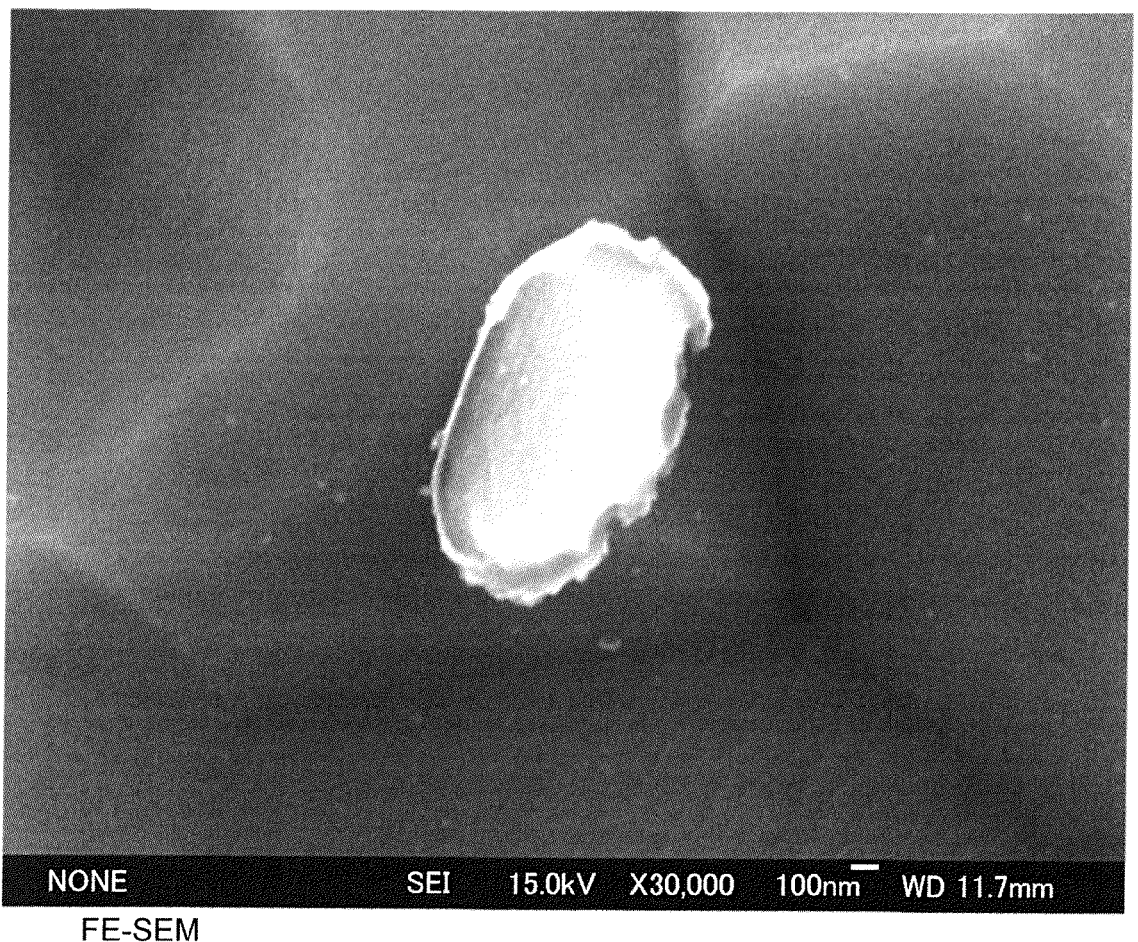
[FIG. 1] This is an FE-SEM image of the S deposits observed on the crystal structure surface.

The titanium target for sputtering of the present invention is a high-purity target having a purity of 99.995 mass percent or higher, and more preferably 99.999 mass percent or higher. It goes without saying that the purity of the foregoing titanium target excludes additive components and gas components.

Generally speaking, a certain level of gas components such as oxygen, nitrogen and hydrogen get included more than other impurity elements. While the amount of inclusion of these gas components is desirably small, an amount that is normally included will not be particularly harmful in achieving the object of the present invention.

In high-power sputtering (high-rate sputtering), the target is heated strongly pursuant to the electricity that is introduced for sputtering. Thus, while a sputtering device normally has a mechanism for cooling the target from the rear face thereof, but no matter how the target is cooled, the raising temperature near the sputtering surface of the target is inevitable.

Moreover, in sputtering that is performed for semiconductors, since numerous wafers are automatically delivered and the ON/OFF of sputtering is carried out for each wafer, the target is repeatedly subject to heating/cooling in a cycle corresponding with the delivery of wafers. In high-power sputtering (high-rate sputtering), the temperature amplitude due to this repetition of heating/cooling is significant since the heating is strong.

The problem of the occurrence of fractures and cracks during high-power sputtering (high-rate sputtering) is caused by a low-cycle fatigue breakdown resulting from the repeated thermal expansion/contraction, pursuant to the repetition of the foregoing heating/cooling, that occurs near the target surface, where the temperature becomes highest.

Fractures and cracks occur on the target surface which is subject to high temperature. Meanwhile, while the 0.2% proof stress of titanium will deteriorate pursuant to raising temperature. However, as a result of intense study, the present inventors discovered that it is possible to prevent the occurrence of fractures and cracks caused by a low-cycle fatigue breakdown, even during high-power sputtering (high-rate sputtering), so as long as the material has a 0.2% proof stress of 30 MPa or more at 500° C.

While there are reports that the target surface temperature in high-power sputtering (high-rate sputtering) sometimes reaches 700° C., this is the temperature of the outermost surface that is directly subject to the plasma, and since the temperature near the surface as the bulk to be discussed in terms of strength in the foregoing case is, at maximum, around 500° C., the 0.2% proof stress at 500° C. is an effective index in the present invention.

Purity of a titanium target for use in semiconductors is demanded of a high purity of 99.995 mass percent or higher, and preferably 99.999 mass percent or higher. Nevertheless, generally speaking, the yield stress of a high-purity metal is relatively lower in comparison to the same metal with a low purity, and the 0.2% proof stress at 500° C. of a titanium target having a purity of 99.995 mass percent or higher for use in semiconductors is normally less than 20 MPa.

A major feature of the present invention is that S is contained as an additive component in an amount of 0.5 to 5 mass ppm. While it is difficult to accurately calculate, in a thermodynamic manner, the solubility limit of S of a low concentration region proposed by the present invention relative to Ti, as a result of conducting various analysis, it has been found that, when the amount of S contained in titanium exceeds 5 mass ppm, S becomes deposited in the Ti base metal, and this is undesirable.

The preferred range of adding S is 0.5 to (less than) 3 mass ppm. This is because, even when considering the possible variations, it is possible to basically prevent the deposition of S if the amount of S is (less than) 3 mass ppm.

As a result of adding S, even with a high-purity titanium target having a purity or 99.995 mass percent or higher, the 0.2% proof stress at 500° C. can be made to be 25 MPa or more, and even 30 MPa or more. Moreover, since the additive amount of S is a minute amount of 5 mass ppm or less, the purity of 99.995 mass percent or higher excluding gas components can be maintained even after the addition of S.

As a result of achieving a uniform crystal structure having an average crystal grain size of 60 μm or less, and even 30 μm or less, by performing plastic deformation processing and subsequent heat treatment as needed, stable strength can be obtained. Preferably, the S deposit count in the crystal structure is 20 deposits/mm$^2$ or less, and more preferably 10 deposits/mm$^2$ or less. As described above, since the S deposits will also vary depending on the plastic deformation processing and subsequent heat treatment, it is desirable to carry out the production with the intent of reducing the S deposits as much as possible.

Since the deposits in a sputtering target may potentially cause the generation of arcing and particles, the reduction of deposits is effective. These characteristics can be obtained by S being contained in an amount of 0.5 to 5 mass ppm, and particularly by S being contained in a total amount of 0.5 to (less than) 3 mass ppm.

The foregoing range is a range that can achieve the effectiveness of the present invention. The object of the present invention cannot be achieved if it is less than the lower limit and the characteristics as a high-purity target will be impaired if it exceeds the upper limit. Thus, the foregoing range is used.

In order to manufacture a high-purity target, the well-known molten salt electrolysis may be used. The atmosphere is preferably an inert atmosphere. During electrolysis, the initial cathode current density is set to a lower current density of 0.6 A/cm$^2$ or less. Moreover, the electrolytic temperature is preferably set to 600 to 800° C.

The electrodeposited Ti obtained as described above and S are mixed in a predetermined amount and subject to EB (electron beam) melting, additionally subject to cold solidification to prepare an ingot, and this is subject to hot deformation work such as hot forging or hot extrusion at 800 to 950° C. to prepare a billet. Adjustments are made as necessary in these processing works to destroy the uneven and coarsened cast structure of the ingot to obtain a uniform and fine structure.

The billet obtained as described is cut, and repeatedly subject to cold plastic deformation such as cold forging or cold rolling to apply high strain to the billet, and a disk shape capable of ultimately ensuring the target size is thereby obtained. Note that the foregoing cold forging is preferably performed with a strain amount of 1.0 to 5.0, and the foregoing cold rolling is preferably performed at a processing rate of 50 to 90%. While the foregoing processes may also be performed outside the range of the foregoing conditions, the foregoing conditions are the preferred production conditions of the present invention.

In addition, the target comprising a processed structure accumulated with high strain is subject to a rapid temperature raise using a fluid bed furnace or the like, and heat treatment is performed in a short time at 400 to 600° C. It is thereby possible to obtain a target having a fine recrystallized structure of 60 μm or less, and even 30 μm or less. Since the crystals will become coarsened when the temperature is raised and the heat treatment time is extended, adjustments are required according to the objective of the processes.

With the titanium target of the present invention obtained as described above, the 0.2% proof stress upon heating the target to 500° C. becomes 25 MPa or more, and even 30 MPa or more, and the 0.2% proof stress at a high temperature is high, and an effect of being able to inhibit the generation of cracks and fractures even during high-power sputtering (high-rate sputtering) is yielded.

The crystal grain size of the recrystallized structure and the S deposit count will also change depending on the processing conditions of forging or rolling and the heat treatment conditions. By staying within the foregoing range, it is possible to obtain a target with a fine recrystallized structure of 60 μm or less, and even 30 μm or less, and, since the proof stress can also be made to be 25 MPa or more, and even 30 MPa or more, it will not be a particular problem.

Nevertheless, even in cases where the target is produced under the processing conditions of forging or rolling and the heat treatment conditions exceeding the foregoing range and the crystal grain size of the recrystallized structure or the S deposit count change, by adjusting the S content to be 0.5 to 5 mass ppm, it is possible to maintain a proof stress of 25 MPa or more, and even 30 MPa or more. In other words, the S content is a major factor, and the adjustment of the S content is important.

So as long as the target is not produced under production conditions that are changed drastically, it is possible to maintain a proof stress of 25 MPa or more, and even 30 MPa or more by suitably adjusting the crystal grain size or the S deposit count. As evident from the above, adjustment of the crystal grain size or the S deposit count is a condition for stably maintaining a proof stress of 25 MPa or more, and even 30 MPa or more.

The foregoing manufacturing processes show an example of a method for obtaining the high-purity target of the present invention, and the present invention is not limited to the foregoing manufacturing processes so as long as it is possible to obtain a titanium target for sputtering containing S in an amount of 0.5 to 5 mass ppm in which the remainder is titanium and unavoidable impurities, and of which the purity excluding additive components and gas components is 99.995 mass percent or higher.

EXAMPLES

Examples of the present invention are now explained. Note that these Examples are merely exemplifications and the present invention shall not be limited thereto. Specifically, the present invention covers all modes or modifications other than the Examples included in the scope of technical concept of the present invention.

Example 1

5 mass ppm of S was added to Ti having a purity of 99.995 mass percent and subject to electron beam melting to prepare a Ti ingot. The component analysis results are shown in Table 1. As the processing conditions (processing and heat treatment conditions), the conditions described in paragraphs [0024], [0025], and [0026] were used. However, the heat treatment temperature was set to 400 to 550° C. The same applies to the following Examples.

Example 2

3.5 mass ppm of S was added to Ti having a purity of 99.995 mass percent and subject to electron beam melting to prepare a Ti ingot. The component analysis results are shown in Table 1.

Example 3

2 mass ppm of S was added to Ti having a purity of 99.995 mass percent and subject to electron beam melting to prepare a Ti ingot. The component analysis results are shown in Table 1.

Example 4

1 mass ppm of S was added to Ti having a purity of 99.995 mass percent and subject to electron beam melting to prepare a Ti ingot. The component analysis results are shown in Table 1.

Example 5

3.5 mass ppm of S was added to Ti having a purity of 99.995 mass percent and subject to electron beam melting to prepare a Ti ingot. The component analysis results are shown in Table 1.

Example 6

3.3 mass ppm of S was added to Ti having a purity of 99.995 mass percent and subject to electron beam melting to prepare a Ti ingot. The component analysis results are shown in Table 1.

Example 7

2.2 mass ppm of S was added to Ti having a purity of 99.995 mass percent and subject to electron beam melting to prepare a Ti ingot. The component analysis results are shown in Table 1.

Comparative Example 1

The Ti ingot having a purity of 99.995 mass percent was samely prepared except that S was not added. Comparative Example 1 fails to satisfy the condition of the lower limit of S; namely, 0.5 mass percent. The component analysis results are shown in Table 1.

Comparative Example 2

12 mass ppm of S was added to Ti having a purity of 99.995 mass percent and subject to electron beam melting to prepare a Ti ingot. Comparative Example 1 fails to satisfy the condition of the upper limit of S; namely, 5 mass ppm. The component analysis results are shown in Table 1.

The Ti ingots indicated in foregoing Examples 1 to 7 and Comparative Examples 1 and 2 were processed into a target shape by suitably using the production conditions described in foregoing paragraphs [0023] to [0026].

TABLE 1

| Element | Example 1 | Example 2 | Example 3 | Example 4 | Example 5 | Example 6 | Example 7 | Comparative Example 1 | Comparative Example 2 |
|---|---|---|---|---|---|---|---|---|---|
| Li | <0.005 | <0.005 | <0.005 | <0.005 | <0.005 | <0.005 | <0.005 | <0.005 | <0.005 |
| Be | <0.005 | <0.005 | <0.005 | <0.005 | <0.005 | <0.005 | <0.005 | <0.005 | <0.005 |
| B | <0.01 | <0.01 | <0.01 | <0.01 | <0.01 | <0.01 | <0.01 | <0.01 | <0.01 |
| F | <0.05 | <0.05 | <0.05 | <0.05 | <0.05 | <0.05 | <0.05 | <0.05 | <0.05 |
| Na | <0.01 | <0.01 | <0.01 | <0.01 | <0.01 | <0.01 | <0.01 | <0.01 | <0.01 |
| Mg | <0.01 | <0.01 | <0.01 | <0.01 | <0.01 | <0.01 | <0.01 | <0.01 | <0.01 |
| Al | 0.8 | 0.6 | 0.3 | 0.3 | 0.7 | 0.5 | 0.8 | 1.1 | 0.7 |
| Si | 0.1 | 0.4 | 0.6 | 0.2 | 0.7 | 0.4 | 0.5 | 0.6 | 0.5 |

TABLE 1-continued

| Element | Example 1 | Example 2 | Example 3 | Example 4 | Example 5 | Example 6 | Example 7 | Comparative Example 1 | Comparative Example 2 |
|---|---|---|---|---|---|---|---|---|---|
| P | <0.01 | <0.01 | <0.01 | <0.01 | <0.01 | <0.01 | <0.01 | <0.01 | <0.01 |
| S | 4.7 | 3.1 | 1.7 | 0.5 | 3.5 | 3.3 | 2.2 | <0.01 | 10.5 |
| Cl | 0.13 | 0.07 | 0.13 | 0.06 | 0.05 | 0.04 | 0.07 | 0.02 | 0.08 |
| K | <0.01 | <0.01 | <0.01 | <0.01 | <0.01 | <0.01 | <0.01 | <0.01 | <0.01 |
| Ca | <0.2 | <0.2 | <0.2 | <0.2 | <0.2 | <0.2 | <0.2 | <0.2 | <0.2 |
| Sc | <0.05 | <0.05 | <0.05 | <0.05 | <0.05 | <0.05 | <0.05 | <0.05 | <0.05 |
| Ti | Matrix | Matrix | Matrix | Matrix | Matrix | Matrix | Matrix | Matrix | Matrix |
| V | <0.005 | <0.005 | <0.005 | <0.005 | <0.005 | <0.005 | <0.005 | <0.005 | <0.005 |
| Cr | 0.2 | 0.1 | 0.1 | 0.2 | 0.2 | 0.1 | 0.1 | <0.1 | <0.1 |
| Mn | <0.005 | <0.005 | <0.005 | <0.005 | <0.005 | <0.005 | <0.005 | <0.005 | <0.005 |
| Fe | 4 | 3.8 | 2.3 | 2 | 3.5 | 4.5 | 3.9 | 4.4 | 2.8 |
| Co | <0.005 | <0.005 | <0.005 | <0.005 | <0.005 | <0.005 | <0.005 | <0.005 | <0.005 |
| Ni | 1.1 | 0.5 | 0.6 | 0.8 | 0.8 | 1.2 | 0.9 | 0.7 | 0.7 |
| Cu | 0.3 | 0.2 | 0.3 | 0.2 | 0.4 | 0.2 | 0.5 | 0.2 | 0.3 |
| Zn | <0.05 | <0.05 | <0.05 | <0.05 | <0.05 | <0.05 | <0.05 | <0.05 | <0.05 |
| Ga | <0.05 | <0.05 | <0.05 | <0.05 | <0.05 | <0.05 | <0.05 | <0.05 | <0.05 |
| Ge | <0.05 | <0.05 | <0.05 | <0.05 | <0.05 | <0.05 | <0.05 | <0.05 | <0.05 |
| As | <0.01 | <0.01 | <0.01 | <0.01 | <0.01 | <0.01 | <0.01 | <0.01 | <0.01 |
| Se | <0.05 | <0.05 | <0.05 | <0.05 | <0.05 | <0.05 | <0.05 | <0.05 | <0.05 |
| Br | <0.05 | <0.05 | <0.05 | <0.05 | <0.05 | <0.05 | <0.05 | <0.05 | <0.05 |
| Rb | <5 | <5 | <5 | <5 | <5 | <5 | <5 | <5 | <5 |
| Sr | <3000 | <3000 | <3000 | <3000 | <3000 | <3000 | <3000 | <3000 | <3000 |
| Y | <200 | <200 | <200 | <200 | <200 | <200 | <200 | <200 | <200 |
| Zr | 0.07 | 0.05 | 0.08 | 0.03 | 0.04 | 0.05 | 0.09 | 0.09 | 0.07 |
| Nb | <0.2 | <0.2 | <0.2 | <0.2 | <0.2 | <0.2 | <0.2 | <0.2 | <0.2 |
| Mo | <0.05 | <0.05 | <0.05 | <0.05 | <0.05 | <0.05 | <0.05 | <0.05 | <0.05 |
| Ru | <0.01 | <0.01 | <0.01 | <0.01 | <0.01 | <0.01 | <0.01 | <0.01 | <0.01 |
| Rh | <0.05 | <0.05 | <0.05 | <0.05 | <0.05 | <0.05 | <0.05 | <0.05 | <0.05 |
| Pd | <0.01 | <0.01 | <0.01 | <0.01 | <0.01 | <0.01 | <0.01 | <0.01 | <0.01 |
| Ag | <0.02 | <0.02 | <0.02 | <0.02 | <0.02 | <0.02 | <0.02 | <0.02 | <0.02 |
| Cd | <0.05 | <0.05 | <0.05 | <0.05 | <0.05 | <0.05 | <0.05 | <0.05 | <0.05 |
| In | <0.05 | <0.05 | <0.05 | <0.05 | <0.05 | <0.05 | <0.05 | <0.05 | <0.05 |
| Sn | <0.05 | <0.05 | <0.05 | <0.05 | <0.05 | <0.05 | <0.05 | <0.05 | <0.05 |
| Sb | <0.05 | <0.05 | <0.05 | <0.05 | <0.05 | <0.05 | <0.05 | <0.05 | <0.05 |
| Te | <0.05 | <0.05 | <0.05 | <0.05 | <0.05 | <0.05 | <0.05 | <0.05 | <0.05 |
| I | <0.01 | <0.01 | <0.01 | <0.01 | <0.01 | <0.01 | <0.01 | <0.01 | <0.01 |
| Cs | <0.01 | <0.01 | <0.01 | <0.01 | <0.01 | <0.01 | <0.01 | <0.01 | <0.01 |
| Ba | <0.005 | <0.005 | <0.005 | <0.005 | <0.005 | <0.005 | <0.005 | <0.005 | <0.005 |
| La | <0.005 | <0.005 | <0.005 | <0.005 | <0.005 | <0.005 | <0.005 | <0.005 | <0.005 |
| Ce | <0.005 | <0.005 | <0.005 | <0.005 | <0.005 | <0.005 | <0.005 | <0.005 | <0.005 |
| Pr | <0.005 | <0.005 | <0.005 | <0.005 | <0.005 | <0.005 | <0.005 | <0.005 | <0.005 |
| Nd | <0.005 | <0.005 | <0.005 | <0.005 | <0.005 | <0.005 | <0.005 | <0.005 | <0.005 |
| Sm | <0.005 | <0.005 | <0.005 | <0.005 | <0.005 | <0.005 | <0.005 | <0.005 | <0.005 |
| Eu | <0.005 | <0.005 | <0.005 | <0.005 | <0.005 | <0.005 | <0.005 | <0.005 | <0.005 |
| Gd | <0.005 | <0.005 | <0.005 | <0.005 | <0.005 | <0.005 | <0.005 | <0.005 | <0.005 |
| Tb | <0.005 | <0.005 | <0.005 | <0.005 | <0.005 | <0.005 | <0.005 | <0.005 | <0.005 |
| Dy | <0.005 | <0.005 | <0.005 | <0.005 | <0.005 | <0.005 | <0.005 | <0.005 | <0.005 |
| Ho | <0.005 | <0.005 | <0.005 | <0.005 | <0.005 | <0.005 | <0.005 | <0.005 | <0.005 |
| Er | <0.005 | <0.005 | <0.005 | <0.005 | <0.005 | <0.005 | <0.005 | <0.005 | <0.005 |
| Tm | <0.005 | <0.005 | <0.005 | <0.005 | <0.005 | <0.005 | <0.005 | <0.005 | <0.005 |
| Yb | <0.005 | <0.005 | <0.005 | <0.005 | <0.005 | <0.005 | <0.005 | <0.005 | <0.005 |
| Lu | <0.005 | <0.005 | <0.005 | <0.005 | <0.005 | <0.005 | <0.005 | <0.005 | <0.005 |
| Hf | <0.01 | <0.01 | <0.01 | <0.01 | <0.01 | <0.01 | <0.01 | <0.01 | <0.01 |
| Ta | <5 | <5 | <5 | <5 | <5 | <5 | <5 | <5 | <5 |
| W | <0.01 | <0.01 | <0.01 | <0.01 | <0.01 | <0.01 | <0.01 | <0.01 | <0.01 |
| Re | <0.01 | <0.01 | <0.01 | <0.01 | <0.01 | <0.01 | <0.01 | <0.01 | <0.01 |
| Os | <0.01 | <0.01 | <0.01 | <0.01 | <0.01 | <0.01 | <0.01 | <0.01 | <0.01 |
| Ir | <0.01 | <0.01 | <0.01 | <0.01 | <0.01 | <0.01 | <0.01 | <0.01 | <0.01 |
| Pt | <0.05 | <0.05 | <0.05 | <0.05 | <0.05 | <0.05 | <0.05 | <0.05 | <0.05 |
| Au | <0.05 | <0.05 | <0.05 | <0.05 | <0.05 | <0.05 | <0.05 | <0.05 | <0.05 |
| Hg | <0.1 | <0.1 | <0.1 | <0.1 | <0.1 | <0.1 | <0.1 | <0.1 | <0.1 |
| Ti | <0.01 | <0.01 | <0.01 | <0.01 | <0.01 | <0.01 | <0.01 | <0.01 | <0.01 |
| Pb | <0.01 | <0.01 | <0.01 | <0.01 | <0.01 | <0.01 | <0.01 | <0.01 | <0.01 |
| Bi | <0.01 | <0.01 | <0.01 | <0.01 | <0.01 | <0.01 | <0.01 | <0.01 | <0.01 |
| Th | <0.0001 | <0.0001 | <0.0001 | <0.0001 | <0.0001 | <0.0001 | <0.0001 | <0.0001 | <0.0001 |
| U | <0.0001 | <0.0001 | <0.0001 | <0.0001 | <0.0001 | <0.0001 | <0.0001 | <0.0001 | <0.0001 |

The average crystal grain size of the targets of Examples 1 to 7 and Comparative Example 1 was examined. The results are shown in Table 2. In Examples 1 to 4, the average crystal grain size was 10 μm or less, and the results were favorable. In Examples 5 to 7, the average crystal grain size was 35 to 60 μm or less. While the crystal grain size was large, since there were no fractures and the average number of particles after the sputtering deposition was not so many, the products of Examples 5 to 7 could be used as a target.

Subsequently, the crystal orientation that appears in the target was examined in Examples 1 to 7 and Comparative Examples 1 and 2. The results are similarly shown in Table 2. Note that the Basal plane orientation rate shown in Table 2 was calculated based on the formula shown in Table 3.

TABLE 2

| Item | Unit | Example 1 | Example 2 | Example 3 | Example 4 | Example 5 | Example 6 | Example 7 | Comparative Example 1 | Comparative Example 2 |
|---|---|---|---|---|---|---|---|---|---|---|
| S concentration | mass ppm | 4.7 | 3.1 | 1.7 | 0.5 | 3.5 | 3.3 | 2.2 | <0.01 | 10.5 |
| Average crystal grain size | μm | 7 | 9 | 8 | 8 | 35 | 45 | 60 | 9 | 7 |
| Basal plane orientation ratio | % | 72 | 71 | 74 | 73 | 75 | 74 | 72 | 72 | 73 |

TABLE 3

$$<\text{Crystal orientation content ratio } A> \equiv \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\sum \frac{I_{(hkl)}}{R_{(hkl)}}}$$

$$\sum \frac{I_{(hkl)}}{R_{(hkl)}} \equiv \frac{I_{(010)}}{R_{(010)}} + \frac{I_{(002)}}{R_{(002)}} + \frac{I_{(011)}}{R_{(011)}} + \frac{I_{(012)}}{R_{(012)}} + \frac{I_{(110)}}{R_{(110)}} +$$
$$\frac{I_{(103)}}{R_{(103)}} + \frac{I_{(200)}}{R_{(200)}} + \frac{I_{(112)}}{R_{(112)}} + \frac{I_{(201)}}{R_{(201)}} + \frac{I_{(004)}}{R_{(004)}} +$$
$$\frac{I_{(202)}}{R_{(202)}} + \frac{I_{(014)}}{R_{(014)}} + \frac{I_{(203)}}{R_{(203)}} + \frac{I_{(211)}}{R_{(211)}} + \frac{I_{(114)}}{R_{(114)}} +$$
$$\frac{I_{(212)}}{R_{(212)}} + \frac{I_{(015)}}{R_{(015)}} + \frac{I_{(204)}}{R_{(204)}} + \frac{I_{(300)}}{R_{(300)}} + \frac{I_{(110)}}{R_{(110)}} +$$
$$\frac{I_{(302)}}{R_{(302)}}$$

[Here, $I_{(hkl)}$ is the peak strength of the (hkl) plane that is obtained based on X-ray diffraction, and $R_{(hkl)}$ is the relative intensity ratio (refer to JCPDS Card) of the (hkl) plane.]

As shown in Table 2, no difference could be observed in the average crystal grain size of Examples 1 to 4 and Comparative Examples 1 and 2.

As shown in Table 2, no difference could be observed in the Basal plane orientation ratio of Examples 1 to 7 and Comparative Examples 1 and 2.

Based on Table 2, no difference could be observed in the crystal structure and orientation after the production of the target in Examples 1 to 7 and Comparative Examples 1 and 2. Even in the actual sputtering, the targets of Examples 1 to 7 were equivalent to the target of Comparative Example 1 with regard to the deposition rate and other behaviors.

Subsequently, test pieces were prepared from the targets prepared in Examples 1 to 7 and Comparative Examples 1 and 2, and were subject to a tension test at 500° C. to measure the 0.2% proof stress at the time. The test piece was measured at the following three points; namely, center, ½ R, and outer periphery of the target. The results are shown in Table 4.

The tension test conditions were as follows.

Test piece shape: JIS shape (G056711-6)

Test method: In accordance with JISG0567

Tester: 100 kN high-temperature tension tester

Test temperature: 500° C.

Gauge length: 30 mm

Test rate: Displacement control of 0.3%/min, and 7.5%/min from the proof stress onward Rate of raising temperature: 45° C./min, held for 15 minutes Temperature measurement: The center of a test piece is fixed to thermocouple Moreover, test pieces of 15 mm×15 mm were prepared from the targets produced in Examples 1 to 7 and Comparative Examples 1 and 2, subject to electrolytic polishing and etching to create a surface for observing the crystal structure, and the surface was observed with FE-SEM (JSM-7000F manufactured by JEOL) at an accelerating voltage of 15 kV and magnification of 2000× to examine the S deposits in the Ti crystal structure. In the foregoing case, the area per visual field is $2.7 \times 10^{-3}$ mm$^2$.

The S deposit count was confirmed via FE-SEM observation based on the foregoing conditions, and deposit-like foreign substances were observed and confirmed based on EDX analysis of the field that they are S deposits with components S or a silicon sulfide compound. Plural visual fields of the respective samples were observed based on the foregoing operation to measure the S deposit count, and the deposit count per unit area was calculated from the obtained average number of deposits.

Figure 2:
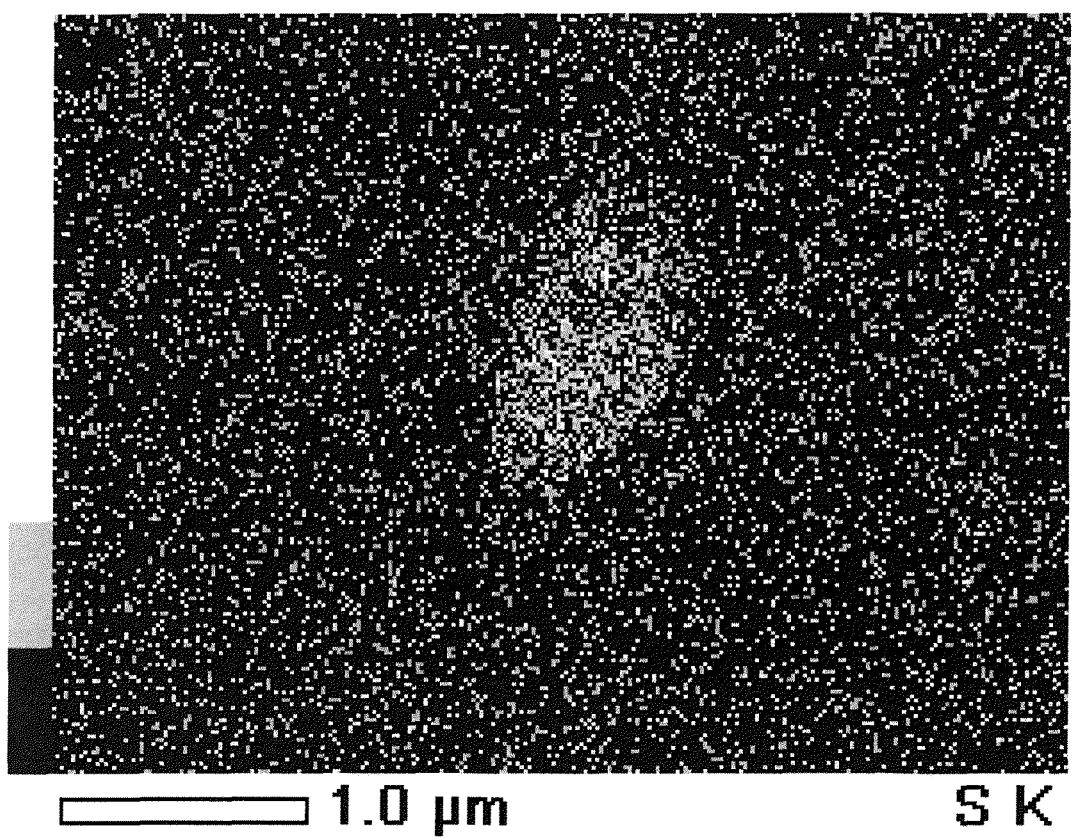
[FIG. 2] This is an EDX image of the S deposits observed on the crystal structure surface.

The results are shown in Table 4. Note that when no deposits could be observed upon the observance of 40 visual fields, the results were indicated as less than 10 deposits/mm$^2$. Moreover, examples of the FE-SEM image and the EDX image thereof are shown in FIG. 1 and FIG. 2. Note that the images shown in FIG. 1 and FIG. 2 are both examples that were observed in Example 1.

Moreover, the targets produced in Examples 1 to 7 and Comparative Examples 1 and 2 were set in a sputtering device and actually subject to high-power sputtering, and the existence of fractures of the target was examined and the number of particles on the 300 mm silicon wafer on which Ti was deposited based on sputtering was measured. The results are shown in Table 4.

TABLE 4

| Item | Unit | Example 1 | Example 2 | Example 3 | Example 4 | Example 5 | Example 6 | Example 7 | Comparative Example 1 | Comparative Example 2 |
|---|---|---|---|---|---|---|---|---|---|---|
| S concentration | mass ppm | 4.7 | 3.1 | 1.7 | 0.5 | 3.5 | 3.3 | 2.2 | <0.01 | 10.5 |
| 0.2% proof stress (500° C.) | Mpa | 41 | 44 | 46 | 34 | 28 | 26 | 25 | 18 | 45 |
| S deposit count | deposits/mm$^2$ | 20 | 10 | <10 | <10 | 70 | 90 | 50 | <10 | 180 |
| Fractures/cracks in sputtering test | — | None | None | None | None | None | None | None | Observed | None |
| Average partical count after sputter deposition | particles/ wafer plane | 4.1 | 2.8 | 3.7 | 3.4 | 5.1 | 6.3 | 4.3 | 3.3 | 8.6 |

Particles of 90 nm or larger were counted

Consequently, the average value for the tension test in Examples 1 to 4 was such that the 0.2% proof stress is 30 MPa or more in all cases, and stable characteristics were obtained. In Examples 5 to 7, the 0.2% proof stress was in the range of 25 to 28 MPa. Moreover, no fractures or cracks occurred in the target in a high-power sputtering (high-rate sputtering) test in all cases.

In Examples 5 to 7, while the 0.2% proof stress was slightly lower in comparison to Examples 1 to 4, this is considered to be a result of the heat treatment temperature being set to be slightly higher than Examples 1 to 4 (provided, however, that the upper limit was set to 600° C.), and it thereby resulted in the increase in the average crystal grain size and consequently resulted in the increase in the S deposit count. Nevertheless, since no fractures or cracks occurred in a high-power sputtering (high-rate sputtering) test, it could be said that these targets can withstand actual use.

Meanwhile, Comparative Example 1 failed to satisfy the condition of the 0.2% proof stress being 25 MPa or more, and, in a high-power sputtering (high-rate sputtering) test, after eroding the target surface by approximately 1 mm via sputtering and thereafter opening the sputtering chamber to visually observe the target surface, several fractures having a width of roughly 0.1 to 2 mm were observed at the portion where the erosion is deepest.

Meanwhile, in Comparative Example 2, the 0.2% proof stress is 30 MPa or more, and there were no fractures or cracks in the target in a high-power sputtering (high-rate sputtering) test, but the average number of particles was roughly double in comparison to Comparative Example 1 and Examples 1 to 7. In Comparative Example 2, the S deposit count was also higher in comparison to Examples 1 to 4, and it could be said that the S deposit count is one cause in the generation of particles.

Accordingly, a titanium target for sputtering as with the present invention, which contains, as an additive component, S in an amount of 0.5 to 5 mass ppm, and more preferably contains S in a total amount of 0.5 to (less than) 3 mass ppm, and of which the purity excluding additive components and gas components is 99.995 mass percent or higher, can yield a significant effect of preventing the generation of fractures and cracks even in a high-power sputtering (high-rate sputtering) test.

INDUSTRIAL APPLICABILITY

Since the present invention is able to provide a high-quality titanium target for sputtering which is free from fractures and cracks during high-power sputtering (high-rate sputtering) and is capable of stabilizing the sputtering characteristics, the present invention is useful in forming thin films for electronic devices and the like.

The invention claimed is:

1. A high-purity titanium target for sputtering containing 0.5 to 5 mass ppm of S in total as an additive component, wherein a purity of the target excluding the additive component and gas components is 99.995 mass percent or higher, and a S deposit count in a crystal structure of the titanium target is 100 deposits/mm$^2$ or less.

2. The titanium target for sputtering according to claim 1, wherein the purity of the target excluding the additive component and gas components is 99.999 mass percent or higher.

3. The titanium target for sputtering according to claim 1, wherein an average crystal grain size of the target is 60 μm or less.

4. The titanium target for sputtering according to claim 1, wherein an average crystal grain size of the target is 30 μm or less.

5. The titanium target for sputtering according to claim 1, wherein 0.2% proof stress of the titanium target upon heating the target to 500° C. is 25 MPa or more.

6. The titanium target for sputtering according to claim 1, wherein the S deposit count in the crystal structure of the titanium target is 30 deposits/mm$^2$ or less.

7. The titanium target for sputtering according to claim 1, wherein the S deposit count in the crystal structure of the titanium target is 10 deposits/mm$^2$ or less.

8. A high-purity titanium target for sputtering containing 0.5 to less than 3 mass ppm of S in total as an additive component, wherein a purity of the target excluding the additive component and gas components is 99.995 mass percent or higher, and a S deposit count in a crystal structure of the titanium target is 100 deposits/mm$^2$ or less.

9. The titanium target for sputtering according to claim 8, wherein the purity of the target excluding the additive component and gas components is 99.999 mass percent or higher.

10. The titanium target for sputtering according to claim 9, wherein an average crystal grain size of the target is 60 μm or less.

11. The titanium target for sputtering according to claim 9, wherein an average crystal grain size of the target is 30 μm or less.

12. The titanium target for sputtering according to claim 11, wherein 0.2% proof stress of the titanium target upon heating the target to 500° C. is 25 MPa or more.

13. The titanium target for sputtering according to claim 11, wherein 0.2% proof stress of the titanium target upon heating the target to 500° C. is 30 MPa or more.

14. The titanium target for sputtering according to claim 13, wherein the S deposit count in the crystal structure of the titanium target is 30 deposits/mm$^2$ or less.

15. The titanium target for sputtering according to claim 13, wherein the S deposit count in the crystal structure of the titanium target is 10 deposits/mm² or less.

16. The titanium target for sputtering according to claim 8, wherein an average crystal grain size of the target is 60 μm or less.

17. The titanium target for sputtering according to claim 8, wherein 0.2% proof stress of the titanium target upon heating the target to 500° C. is 25 MPa or more.

* * * * *